(12) United States Patent
Su et al.

(10) Patent No.: US 7,516,425 B2
(45) Date of Patent: Apr. 7, 2009

(54) METHOD FOR GENERATING MINIMAL LEAKAGE CURRENT INPUT VECTOR USING HEURISTICS

(75) Inventors: Peisheng Alan Su, Hsinchu (TW); Li-Chuan Weng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 483 days.

(21) Appl. No.: 11/315,695

(22) Filed: Dec. 22, 2005

(65) Prior Publication Data

US 2007/0150843 A1 Jun. 28, 2007

(51) Int. Cl.
G06F 17/50 (2006.01)
G06F 9/45 (2006.01)

(52) U.S. Cl. .................. 716/2; 716/1; 716/3; 716/4; 716/18; 703/14; 703/22

(58) Field of Classification Search .............. 716/1–4; 714/33; 703/22; 327/534; 326/86
See application file for complete search history.

(56) References Cited

U.S. PATENT DOCUMENTS

| | | | | |
|---|---|---|---|---|
| 5,801,958 | A * | 9/1998 | Dangelo et al. | 716/18 |
| 6,158,022 | A * | 12/2000 | Avidan | 714/33 |
| 6,191,606 | B1 * | 2/2001 | Ye et al. | 326/31 |
| 6,330,977 | B1 * | 12/2001 | Hass et al. | 235/487 |
| 6,345,379 | B1 * | 2/2002 | Khouja et al. | 716/4 |
| 6,515,513 | B2 | 2/2003 | Ye et al. | 326/83 |
| 6,687,883 | B2 * | 2/2004 | Cohn et al. | 716/4 |
| 6,915,252 | B1 * | 7/2005 | Li | 703/22 |
| 7,003,738 | B2 * | 2/2006 | Bhattacharya et al. | 716/1 |
| 7,276,956 | B2 * | 10/2007 | Furuta et al. | 327/534 |
| 7,278,120 | B2 * | 10/2007 | Rahmat et al. | 716/2 |
| 2007/0085567 | A1 * | 4/2007 | Berthold et al. | 326/86 |

OTHER PUBLICATIONS

Rekhi et al.; "HAL: heuristic algorithms for layout synthesis"; Mar. 27-29, 1995; Advanced Research in VLSI; Proceedings., Sixteenth Conference on; pp. 185-199.*
Kwon et al.; "A fast heuristics for optimal CMOS functional cell layout generation"; Jun. 7-9, 1988; Circuits and Systems, 1988., IEEE International Symposium on; pp. 2423-2426 vol. 3.*
Bar-Yehuda et al.; "Depth-first-search and dynamic programming algorithms for efficient CMOS cell generation"; Jul. 1989;☐☐Computer-Aided Design of Integrated Circuits and Systems, IEEE Transactions on; vol. 8, Issue 7, pp. 737-743.*
A Novel Synthesis Approach For Active Leakage Power Reduction Using dynamic Supply Gating Swarup Bhunia, Nilanjan Banerjee, Qikai Chen, Hamid Mahmoodi, and Kaushik Roy School of Electrical And Computer Engineering, Purdue University, West Lafayette p. 479-484.

* cited by examiner

*Primary Examiner*—Helen Rossoshek

(57) ABSTRACT

A method for generating an input vector to reduce the leakage current in an integrated circuit by using heuristics includes transforming the integrated circuit to a logic representation with PMOS and NMOS parts and P and N devices of the integrated circuit into edges, selecting between PMOS and NMOS logic representations the one with deepest serial stack; and for the selected PMOS or NMOS logic representation, assigning weights to the edges, thereby generating a weighted graph. The assignment includes starting from the output terminal to the Power $V_{dd}$ (for PMOS) or Ground $V_{ss}$ (for NMOS), and labeling edge weights in a descending order. The resulted cost function from the method of the present invention can be applied as heuristics in different algorithms, such as branch-and-bound, simulated annealing, or genetic algorithm.

10 Claims, 8 Drawing Sheets

METHOD FOR GENERATING MINIMAL LEAKAGE CURRENT INPUT VECTOR USING HEURISTICS

FIELD OF THE INVENTION

The present invention generally relates to integrated circuits, and more specifically to a method for generating an input vector to reduce the leakage current in an integrated circuit by using heuristics.

BACKGROUND OF THE INVENTION

With the scaling down of integrated circuit (IC) design, the leakage current imposes severe power problem for devices with IC. The power consumed by an integrated circuit can be categorized as dynamic, static and current leakage, respectively. The leakage current consumes the power and generates heat even when the circuit is not in operation; hence, minimizing the leakage current can alleviate both the power consumption and the heat dissipation problems.

U.S. Pat. No. 6,191,606 B1 (2001), "Method and apparatus for reducing standby leakage current using input vector activation" disclosed a method and an apparatus for reducing standby leakage current in CMOS circuit using selected input vectors. FIG. 1 shows the conceptual model of how an input vector can be used to turn off part of the circuit. When a normal clock Clk1 is applied to the input register 101, an input vector is applied to the combination logic circuit 103, which operates to generate an output vector. When a gated clock Clk2 is applied to the input vector, a pre-determined input vector is applied to the combinational logic circuit 103 to turn off part of the circuit to minimize the leakage current for reducing power consumption. However, the drawback of the patent is that the pre-determined input vector must be manually determined by visual inspection to the given logic circuit.

U.S. Pat. No. 6,515,513 B2 (2002) disclosed a system and method for inserting leakage reduction control in logic circuits. In this patent, a probabilistic analysis algorithm based on a user-defined probability is used to compute the input vector for leakage current reduction.

Step 302 in FIG. 3A is to select between the PMOS and the NMOS logic representations the one with deepest serial stack. The operation of step 302 is shown in FIG. 3b and further described as follows. Referring to FIG. 3b, the depths of the two sub-graphs WFp and WFn are first determined, respectively, as shown in step 302a. By performing a depth-first search (DFS) algorithm from the output terminal node to the Power $V_{dd}$ and Ground $V_{ss}$ to find the longest path with most edges, i.e., the depth, traversed in each sub-graph. Step 302b is to determine whether the depth of sub-graph WFp is greater than or equals to the depth of sub-graph WFn. If so, the sub-graph WFp is used for the following weight assignment step, as illustrated in step 302c, i.e. $WF_T$=WFp. Otherwise, WFn is used, as illustrated in step 302d, i.e. $WF_T$=WFn. In other words, $WF_T$ is the maximum of WFp and WFn.

The leakage current of a TSMC 0.13 um CMOS 4-input NOR gate with respect to different inputs is measured and found to have the differences between maximum and minimum leakage currents of an order of two. Another observation is that the closer the off-state devices are to the output terminal, the lower the leakage current is. This phenomenon implies that an optimization factor based on the above observation can be used as a heuristic design to compute an optimal input vector for minimizing leakage current.

SUMMARY OF THE INVENTION

The present invention has been made to overcome the above-mentioned drawback of conventional leakage current reduction techniques. The primary object of the present invention is to provide a method for generating an input vector to integrated circuits so as to minimize the leakage current.

To achieve the above objects, the present invention provides a method using greedy heuristics with output terminal biased off-state stacking device as the optimization factor to generate an input vector to integrated circuits for minimizing the leakage current. The method includes the following steps of: (a) transforming an integrated circuit to a logic representation with PMOS and NMOS parts, and P and N devices of the integrated circuit into edges; (b) selecting between PMOS and NMOS logic representations the one with deepest serial stack; and (c) for the selected PMOS or NMOS logic representation, assigning weights to the edges, the assignment including starting from the output terminal to the Power $V_{dd}$ (for PMOS) or Ground $V_{ss}$ (for NMOS), and labeling edge weights in a descending order. The resulted cost function from the method of the present invention can be applied as heuristics in different algorithms, such as branch-and-bound, simulated annealing, or genetic algorithm.

The foregoing and other objects, features, aspects and advantages of the present invention will become better understood from a careful reading of a detailed description provided herein below with appropriate reference to the accompanying drawings.

DETAILED DESCRIPTION OF THE EMBODIMENTS

Figure 1:
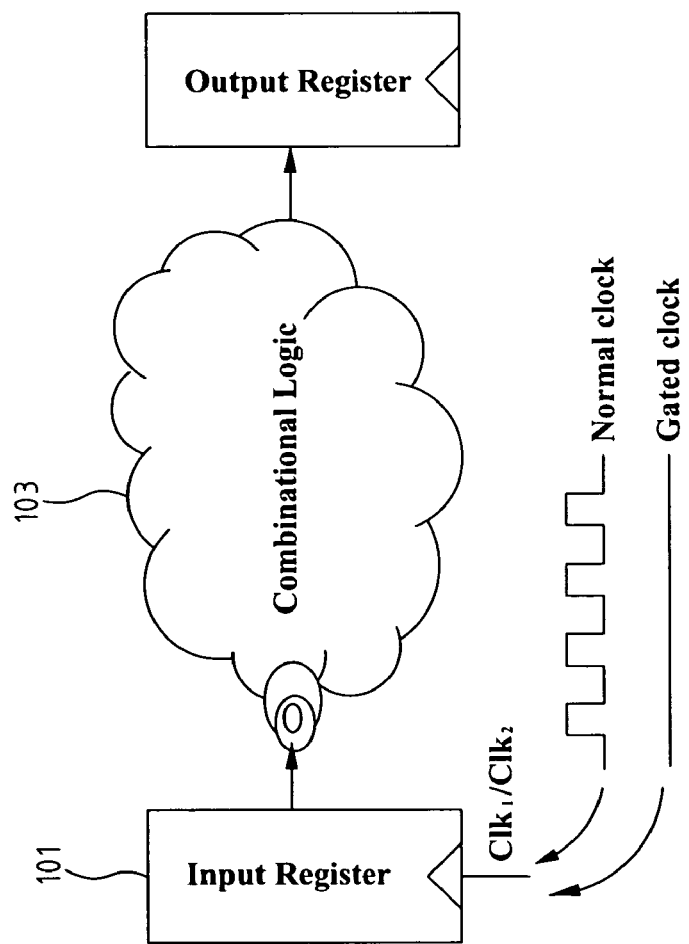
FIG. 1 shows a schematic view of a gated input using the gated clock to the input register.
Figure 2:
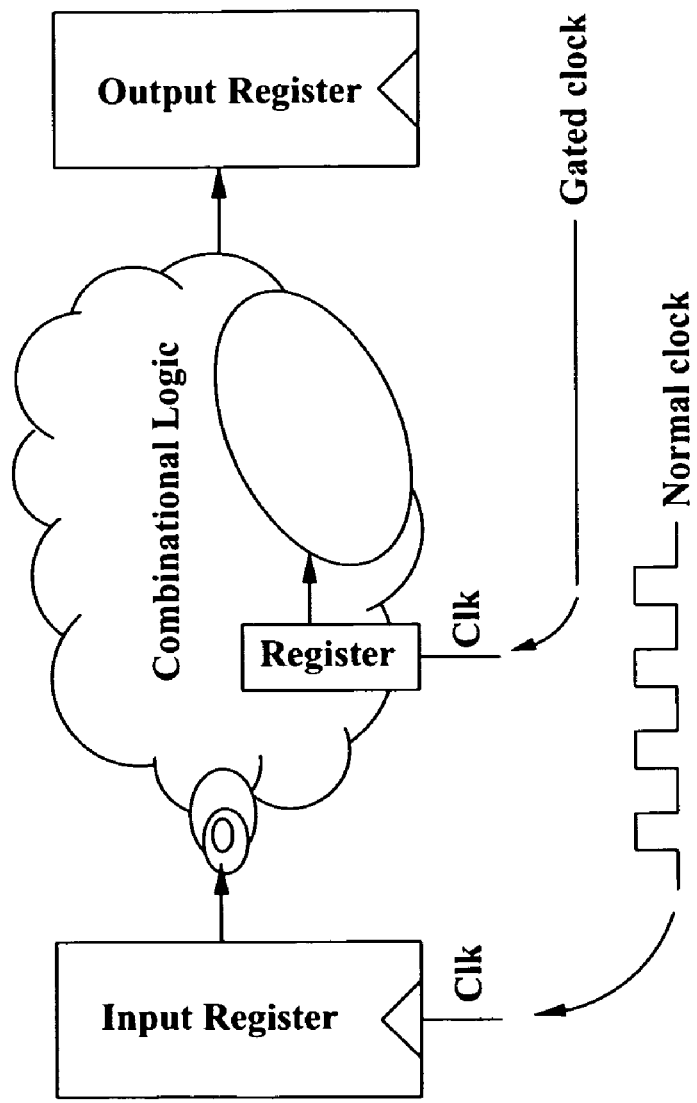
FIG. 2 shows a schematic view of gating idle circuit block in active mode.
Figure 3A:
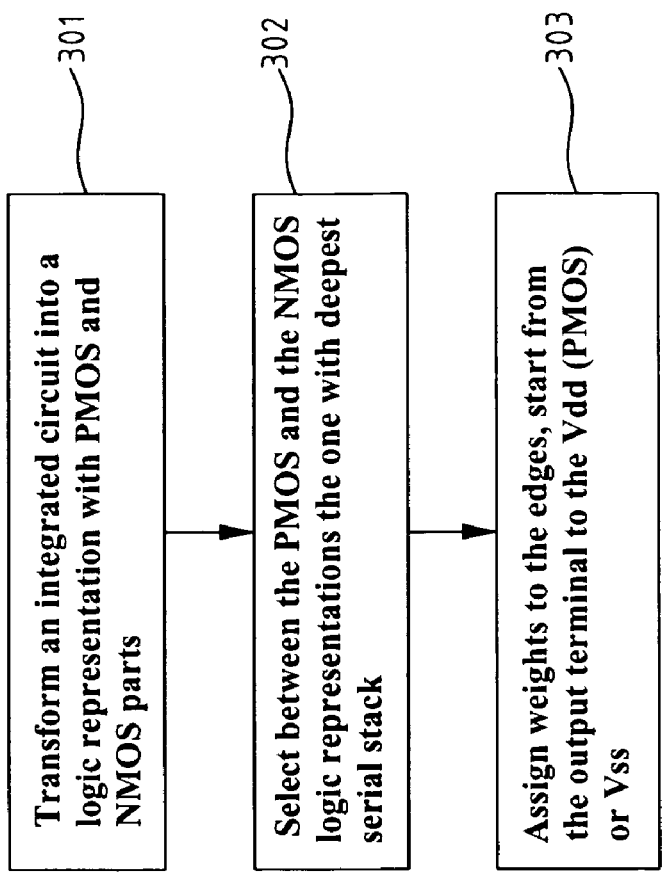
FIG. 3A shows a flowchart illustrating the method of the present invention.

FIG. 3A shows a flowchart illustrating the method for generating input vector for minimizing the leakage current of the present invention. Referring to FIG. 3A, step 301 is to transform an integrated circuit, for example a CMOS circuit, into a logic representation with PMOS and NMOS parts. To more understand the operation of step 301, consider the following detailed description. For a given CMOS circuit, Vdd, Vss, output terminals and all wire connection points are transformed into nodes, and P and N devices of the given CMOS circuit are transformed into edges. To simplify the graph, only one node is used to represent connected edges. For example, if there are 10 devices directly connected to an output terminal, only one node is used to represent the output terminal. The transformed weighted graph is called WF, including two sub-graphs called, WFp (for PMOS) and WFn (for NMOS), respectively.

Figure 3B:
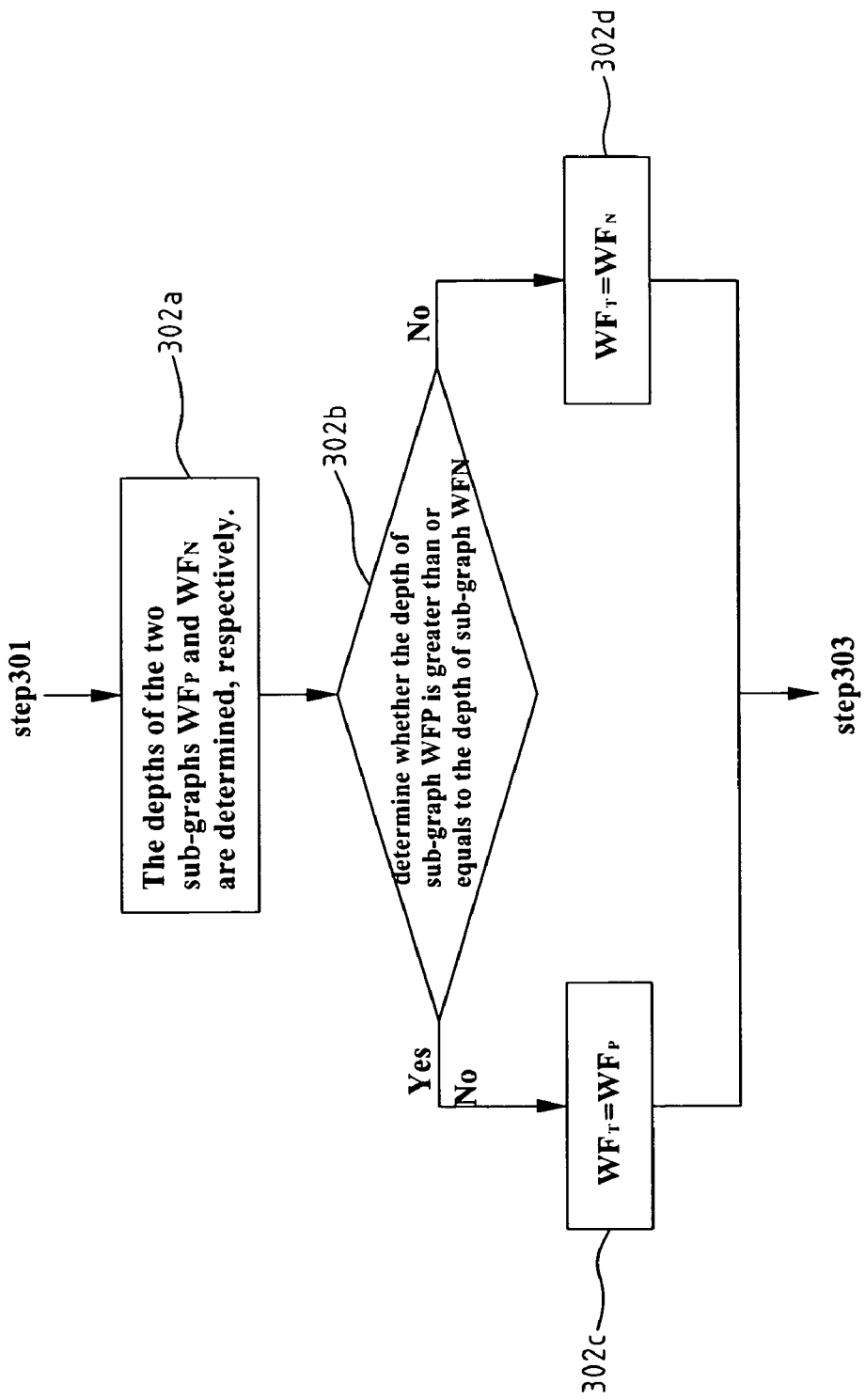
FIG. 3B shows a flow diagram illustrating the second step in FIG. 3A.

Step 302 in FIG. 3A is to select between the PMOS and the NMOS logic representations the one with deepest serial stack. The operation of step 302 is shown in FIG. 3b and further described as follows. Referring to FIG. 3b, the depths of the two sub-graphs WFP and WFN are first determined, respectively, as shown in step 302a. By performing a depth-first search (DFS) algorithm from the output terminal node to the Power $V_{dd}$ and Ground $V_{ss}$ to find the longest path with most edges, i.e., the depth, traversed in each sub-graph. Step 302b is to determine whether the depth of sub-graph WFP is greater than or equals to the depth of sub-graph WFN. If so, the sub-graph WFP is used as for the following weight assignment step, as illustrated in step 302c, i.e. $WF_T$=WFP. Otherwise, WFN is used, as illustrated in step 302d, i.e. $WF_T$=WFN. In other words, $WF_T$ is the maximum of WFP and WFN.

It is worth noticing that in the case of equal depth for both sub-graphs, either WFP or WFN can be used for weight assignment computation. However, because PMOS provides a better leakage control in general, sub-graph WFP is usually selected when both sub-graphs have equal depth. However, if different manufacturing process is used so that NMOS provides a better leakage control, the sub-graph WFN can be selected for weight assignment.

Referring back to FIG. 3A, on the PMOS or NMOS selected in step 302, step 303 is to assign weights to the edges, start from the output terminal to the Power $V_{dd}$ (PMOS) or Ground $V_{ss}$ (NMOS), and label edge weights in a descending fashion. The operation of step 303 is further described as follows. A depth-first search (DFS) or breadth-first search (BFS) algorithm is performed to the selected sub-graph to assign a weight to each edge. The assignment starts from the output terminal with the heaviest weight towards Power $V_{dd}$ or Ground $V_{ss}$ in a non-decreasing order. The weight assigned to each edge is not limited to any specific value as long as they form a non-increasing sequence as they move towards Power $V_{dd}$ or Ground $V_{ss}$. In general a decreasing sequence is preferred; however, if the depth is large, for example, deeper than 10, a non-increasing order can simplify the computation.

Based on the weighted graph generated in the above step 303, a heuristics is selected to find an input vector which creates a maximal weight sum. The heuristics is only for algorithm realization, and not limited to any specific type, such as branch-and-bound, simulated annealing, and genetic algorithm.

Figure 4A:
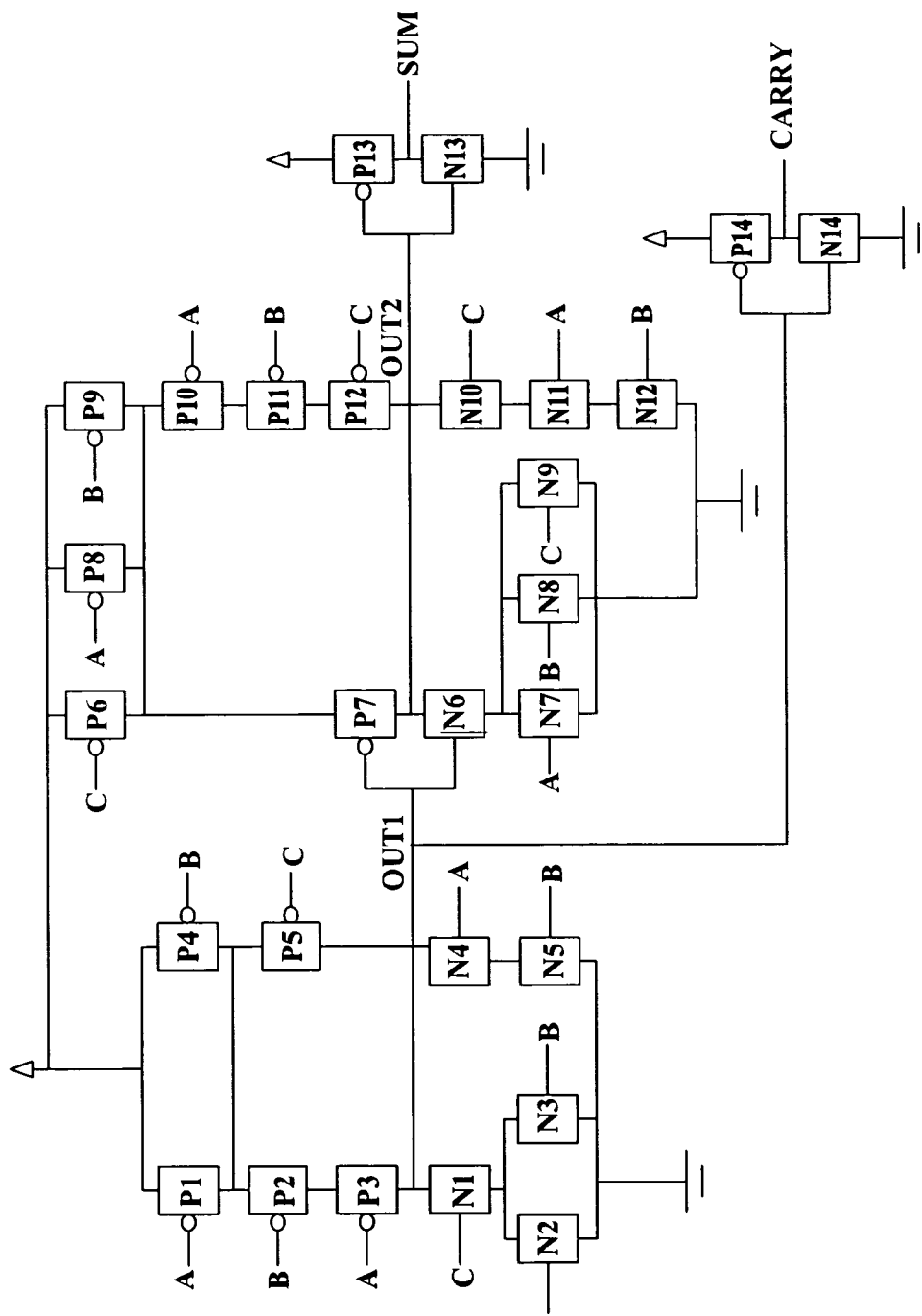
FIG. 4A shows a PMOS and NMOS logic representation diagram of an example CMOS circuit.
Figure 4B:
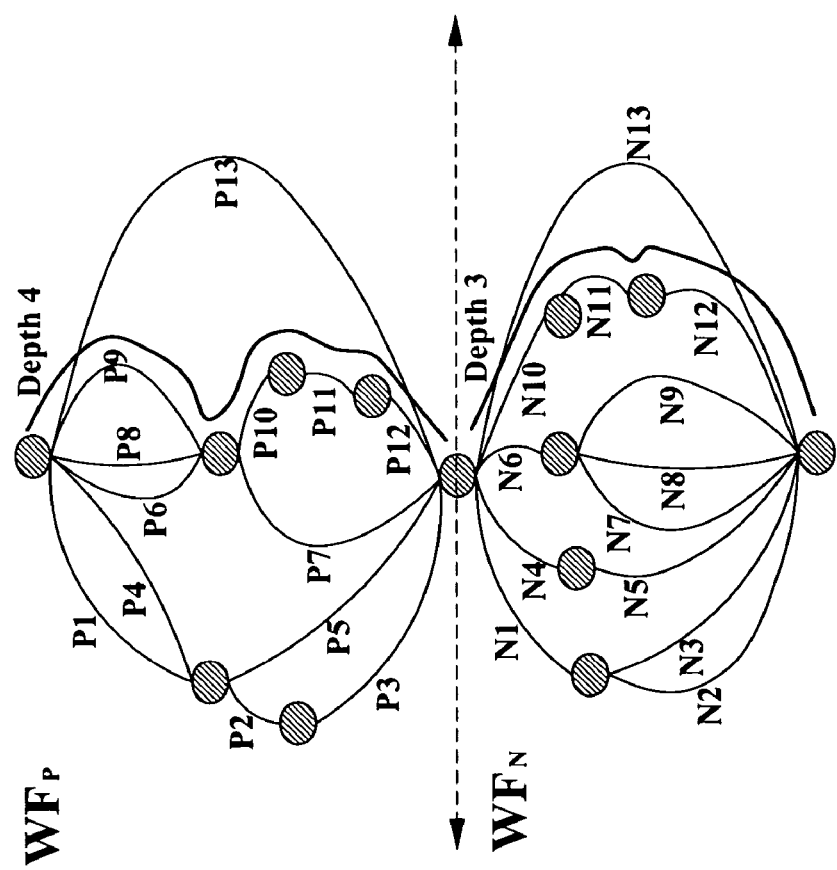
FIG. 4B shows a weighted graph WF with two sub-graphs WFp and WFn for the example logic representation in FIG. 4A.

FIGS. 4A-4D shows an example of using the method of the present invention to determine an input vector for a CMOS circuit. FIG. 4A shows the PMOS and NMOS logic representations of the CMOS circuit. FIG. 4B shows the weighted graph WF generated by applying the step 301 of FIG. 3A to transform the PMOS/NMOS logic representation into WFP and WFN, respectively. It is worth noticing that the depth of WFP is four and the depth of WFN is 3. Therefore, the sub-graph WFP is used for the following weight assignment.

Figure 4C:
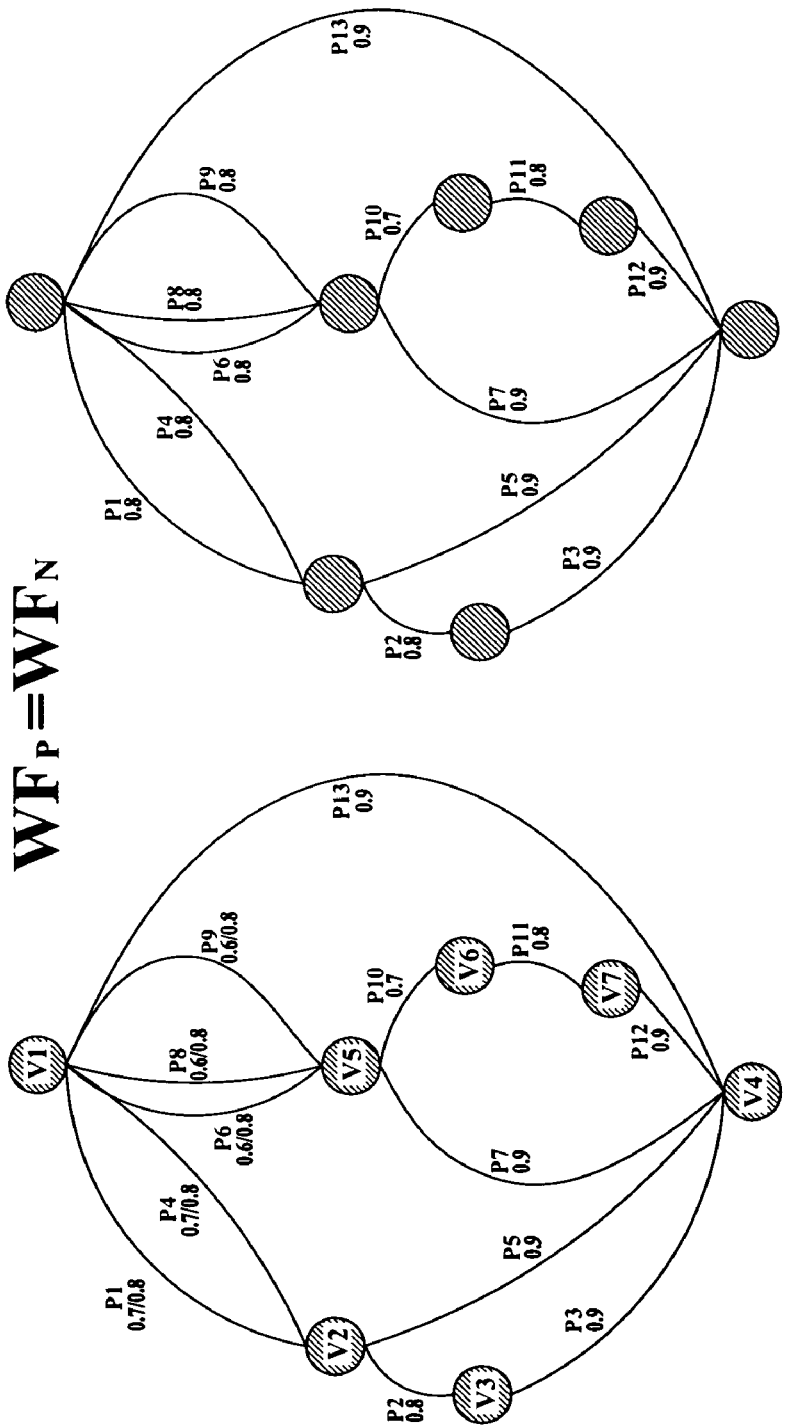
FIG. 4C shows weight assignment to sub-graph WFp of FIG. 4B.

FIG. 4C shows the weight assigned to each edge in the sub-graph WFP. In the left figure of FIG. 4C, the weight assignment starts with output terminal V4, and moves towards V1 ($V_{dd}$). On each edge visited, the heaviest weight is assigned to the ones closest to V4, and decreased the weight further away from V4. As aforementioned, the weights are not limited to any specific value as long as they form a non-increasing sequence. In this process, an edge may have more than one weight assignment, for example, P1, P4, P6, P8 and P9. Under these circumstances, the heaviest weight assignment is used and the final weight assignment is in the figure on the right of FIG. 4C.

Figure 4D:
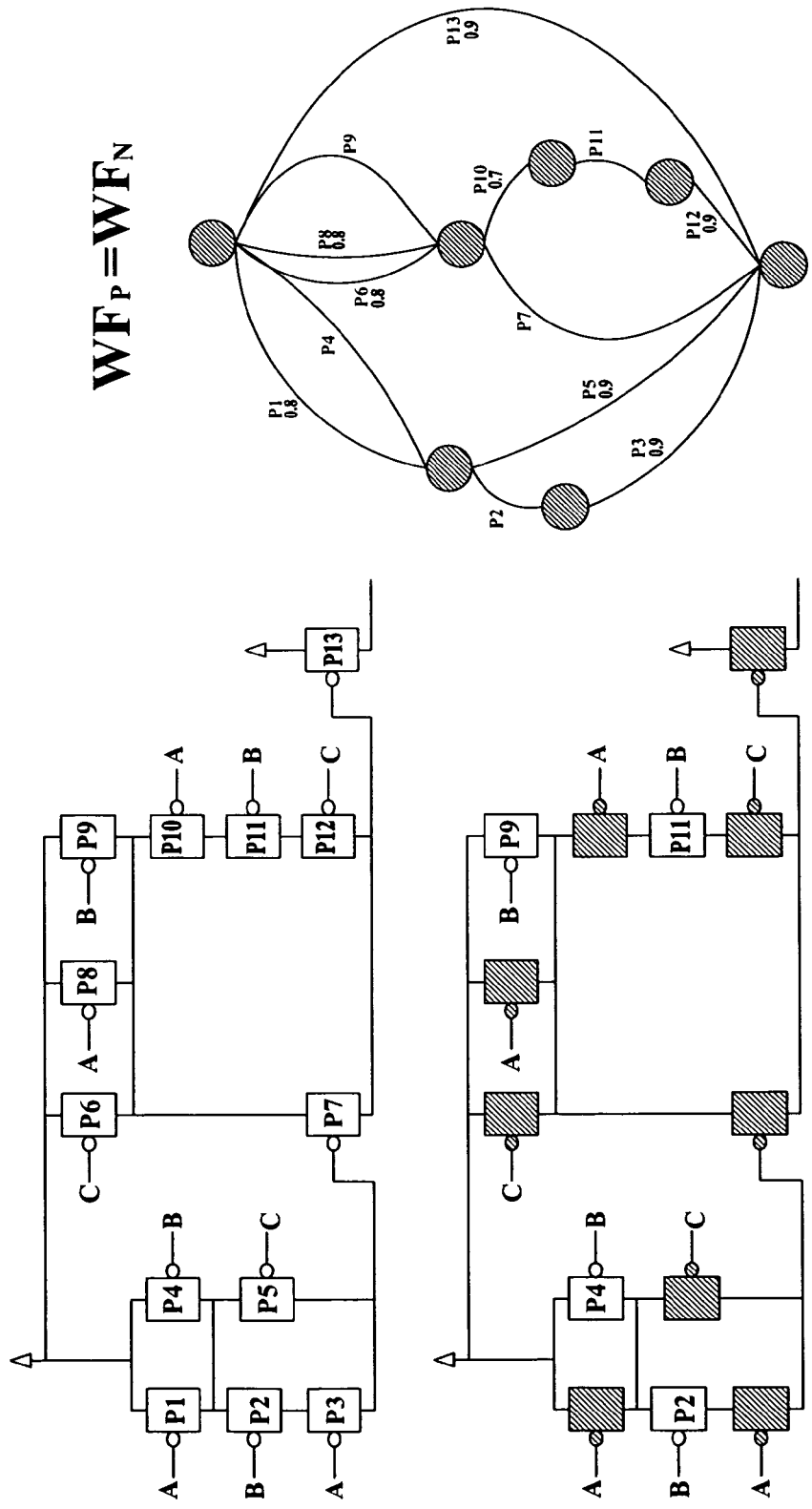
FIG. 4D shows a computed result for the example in FIG. 4A using the present invention and a branch-and-bound algorithm.

FIG. 4D shows the input vector with minimal leakage current computed using a branch-and-bound algorithm using the above weighted graph generated in FIG. 4C. As shown in FIG. 4D, the total weight is 6.7 by assigning the values {1, 0, 1} to the input vector {A, B, C}. The figure at the bottom of FIG. 4D shows the off-state devices with respect to the computed input vector in black nodes. It is worth noticing that other heuristics, such as simulated annealing or genetic algorithm can be used to compute the input vector with the minimal leakage current. The input vector is thus used as the input for the gating logic to feed into the circuitry as the gated input.

From the above description, it can be seen that this invention uses greedy heuristics with output terminal biased off-state stacking device as the optimization factor and quickly generates the input vector to integrated circuits for minimizing the leakage current. The resulted cost function from the method of the present invention can be applied as heuristics in different algorithms, such as branch-and-bound, simulated annealing, genetic algorithm, etc.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for generating an input vector to reduce the leakage current in an integrated circuit by using heuristics, said method comprising the steps of:
   transforming circuit layout of said integrated circuit into a logic representation with PMOS part and NMOS part, and P and N devices of said integrated circuit into edges;
   selecting between said PMOS part and NMOS part of said logic representation the part with deepest serial stack;
   making weight assignment to the edges of said selected part, said weight assignment starting from an output terminal in said selected part to a Power $V_{dd}$ or Ground $V_{ss}$ in said selected part in a non-increasing order;
   generating a weighted graph based on said selected part and said weight assignment; and
   applying a heuristics algorithm using said weighted graph to generate said input vector for said integrated circuit.

2. The method as claimed in claim 1, wherein said integrated circuit is a CMOS circuit.

3. The method as claimed in claim 1, wherein said heuristics algorithm is a branch-and-bound algorithm.

4. The method as claimed in claim 1, wherein said heuristics algorithm is a simulated annealing algorithm.

5. The method as claimed in claim 1, wherein said heuristics algorithm is a genetic algorithm.

6. The method as claimed in claim 1, wherein a depth first search is performed to determine depth of said PMOS part or said NMOS part of said logic representation for selecting the part with deepest serial stack.

7. The method as claimed in claim 1, wherein said PMOS part is selected for weight assignment when said PMOS part and said NMOS part of said logic representation have the same depth and a PMOS foundry technology provides a better leakage current control.

8. The method as claimed in claim 1, wherein said NMOS part is selected for weight assignment when said PMOS part and said NMOS part of said logic representation have the same depth and an NMOS foundry technology provides a better leakage current control.

9. The method as claimed in claim 1, wherein a depth-first search algorithm is performed to assign weight to the edges of said selected part.

10. The method as claimed in claim 1, wherein a breadth-first search algorithm is performed to assign weight to the edges of said selected part.

* * * * *